(12) United States Patent
Maggi et al.

(10) Patent No.: US 6,215,292 B1
(45) Date of Patent: Apr. 10, 2001

(54) METHOD AND DEVICE FOR GENERATING AN OUTPUT CURRENT

(75) Inventors: Riccardo Maggi; Adam Ghozeil, both of Corvallis, OR (US)

(73) Assignees: STMicroelectronics S.R.L., Agrate Brianza (IT); Hewlett-Packard Company, Corvallis, OR (US)

( * ) Notice: Subject to any disclaimer, the term of this patent is extended or adjusted under 35 U.S.C. 154(b) by 0 days.

(21) Appl. No.: 09/382,244

(22) Filed: Aug. 25, 1999

(51) Int. Cl.[7] ........................................................ G05F 3/16
(52) U.S. Cl. .......................... 323/315; 327/346; 327/350
(58) Field of Search ................................... 323/311, 312, 323/313, 315; 327/346, 347–350

(56) References Cited

U.S. PATENT DOCUMENTS

| | | | | |
|---|---|---|---|---|
| 5,521,544 | * | 5/1996 | Hatanaka | 327/356 |
| 5,585,757 | * | 12/1996 | Frey | 327/348 |
| 5,680,038 | * | 10/1997 | Fiedler | 323/315 |
| 5,835,994 | * | 11/1998 | Adams | 323/315 |
| 5,880,625 | * | 3/1999 | Park et al. | 327/543 |
| 5,889,665 | * | 3/1999 | Han | 363/60 |

* cited by examiner

*Primary Examiner*—Peter S. Wong
*Assistant Examiner*—Gary L. Laxton
(74) *Attorney, Agent, or Firm*—Theodore E. Galanthay; Allen, Dyer, Doppelt, Milbrath & Gilchrist, P.A.

(57) ABSTRACT

A power rising electronic device receives an input current and supplies an output current that is a function of a power of the input current having a relative whole-number exponent. The power rising electronic device includes a plurality of diodes equal to an absolute value of the relative whole-number exponent. The plurality of diodes are connected in series with one another to produce from the input current an input voltage that is a logarithmic function of a power of the input current. The electronic device further includes an output junction element, and a circuit for applying a voltage that is a function of the input voltage to the output junction element for producing a current that is an exponential function of the voltage applied thereto. The output current of the power rising electronic device is derived from the current produced in the output junction element.

20 Claims, 3 Drawing Sheets

1

METHOD AND DEVICE FOR GENERATING AN OUTPUT CURRENT

FIELD OF THE INVENTION

The present invention relates to electronics, and, more particularly, to a power rising electronic device and related methods.

BACKGROUND OF THE INVENTION

Power rising electronic devices are commonly used in various applications, such as analog calculating systems, for example. A power rising electronic device provides an output current which is a function of a power of an input current with either a positive or negative relative whole-number exponent. In the case of a square law electronic device, the output current is proportional to the square of the input current.

Power rising electronic devices are formed with one or more multiplier circuits. A disadvantage of this approach is that the electronic device requires a fairly complex structure. If the electronic device is produced in an integrated form on a chip of semiconductor material, a considerable amount of surface area of the semiconductor material is required. Moreover, multiplier circuits require very precise tuning of their components to prevent drift of the output current due to temperature variations, for example.

A different approach includes the use of one or more MOS field effect transistors in which the current at the drain terminal is proportional to the square of the voltage between the source terminal and the gate terminal. However, this relationship is significantly influenced by variations in temperature, and in the drain terminal voltage so that the electronic device is not very precise.

SUMMARY OF THE INVENTION

The object of the present invention is to overcome the above-mentioned drawbacks. To achieve this object, a power rising electronic device receives an input current and supplies an output current that is a function of a power of the input current having a relative whole-number exponent.

The power rising electronic device includes a plurality of diodes equal to the absolute value of the relative whole-number exponent. The diodes are connected in series with one another to produce from the input current an input voltage which is a logarithmic function of a power of the input current having an exponent equal to the absolute value of an output junction element. The electronic device further include means for applying a voltage which is a function of the input voltage to the output junction element to produce a current that is an exponential function of the voltage applied. The output current is derived from the produced current.

A corresponding power rising method is also provided.

BRIEF DESCRIPTION OF THE DRAWINGS

Further characteristics and advantages of the power rising electronic device according to the present invention will be understood from the following description of a preferred embodiment thereof, provided by way of a non-limiting example, with reference to the appended drawings, in which.

DETAILED DESCRIPTION OF THE PREFERRED EMBODIMENTS

Figure 1A:
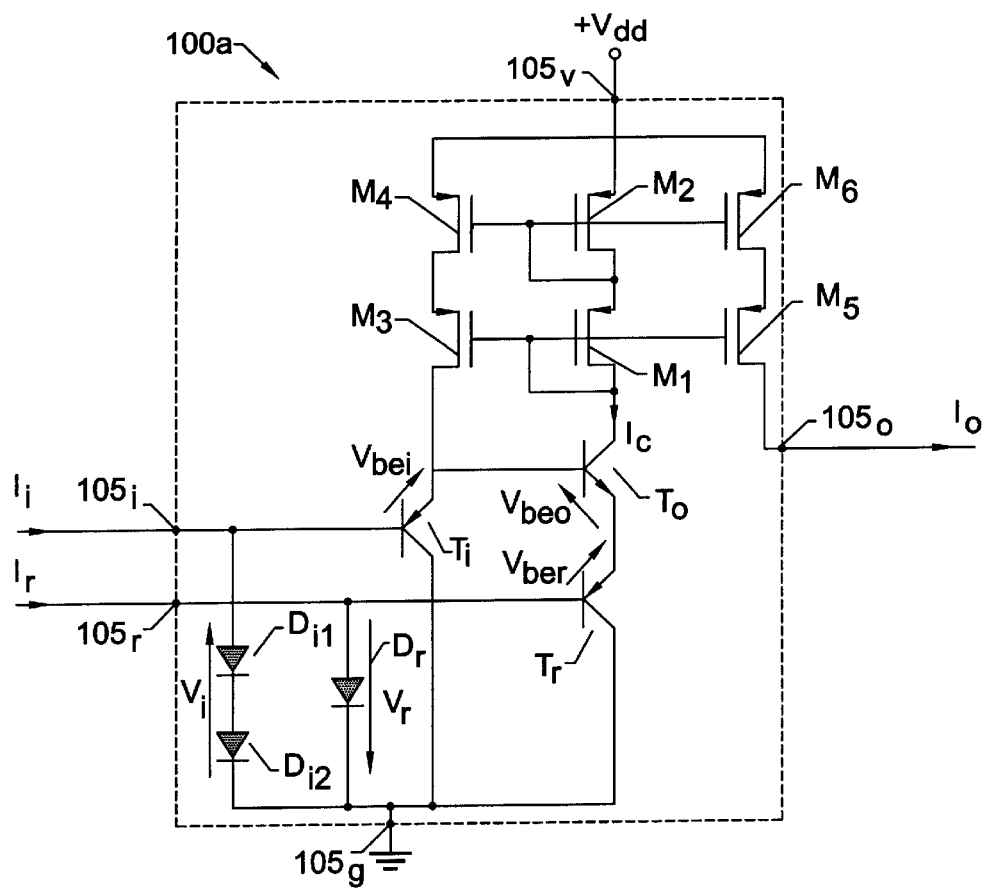
FIG. 1a is a basic circuit diagram of the electronic device according to the present invention.

With reference in particular to FIG. 1a, a square law electronic device 100a produced in an integrated form on a chip of semiconductor material using bipolar-CMOS (BICMOS) technology is shown. The electronic device 100a has two supply terminals 105g and 105v. The supply terminal 105g is connected to a reference terminal, such as ground. The supply terminal 105v is connected to the positive terminal of a direct-current supply +Vdd. The direct-current supply +Vdd is equal to +5V, for example. The negative terminal is connected to ground. The electronic device 100a has an input terminal 105i which receives an input current Ii, an output terminal 105o which supplies an output current Io, and a reference terminal 105r which receives a reference current Ir having a predetermined value.

Two diodes Di1 and Di2 are connected in series between the input terminal 105i and the supply terminal 105g. In particular, the anode terminal of the diode Di1 is connected to the input terminal 105i. The cathode terminal of the diode Di1 is connected to the anode terminal of the diode Di2. The cathode terminal of diode Di2 is connected to the supply terminal 105g. A further diode Dr has its anode terminal connected to the reference terminal 105r, and its cathode terminal connected to the supply terminal 105g.

The electronic device 100a also includes a pnp bipolar transistor Ti having its base terminal connected to the input terminal 105i, and its collector terminal connected to the supply terminal 105g. A further pnp bipolar transistor Tr has its base terminal connected to the reference terminal 105r, and its collector terminal connected to the supply terminal 105g. In the electronic device 100a, there is also an npn bipolar transistor To having its base terminal connected to the emitter terminal of the transistor Ti, and its emitter terminal connected to the emitter terminal of the transistor Tr.

A dual current-mirror with a cascode structure is formed by six p-channel MOS transistors M1, M2, M3, M4, MS, and M6. The current-mirror M1–M6 has an input branch M1, M2 connected to the collector terminal of the transistor To. A first output branch M3, M4 is connected to the emitter terminal of the transistor Ti, and a second output branch MS, M6 is connected to the output terminal 105o.

In particular, the drain terminal of the transistor M1 is connected to the collector terminal of the transistor To. The source terminal of the transistor M1 is connected to the drain terminal of the transistor M2. The source terminal of transistor M2 is connected to the supply terminal 105v. The gate terminals of the transistors M1 and M2 are short-circuited to their respective drain terminals. The drain terminal of the transistor M3 is connected to the emitter terminal of the transistor Ti. The source terminal of the transistor M3 is connected to the drain terminal of the transistor M4. The source terminal of transistor M2 is connected to the supply terminal 105v. Similarly, the drain terminal of the transistor M5 is connected to the output terminal 105o. The source terminal of the transistor M5 is connected to the drain terminal of the transistor M6. The source terminal of transistor M2 is connected to the supply terminal 105v. The gate terminals of the transistors M3, M5 and transistors M4, M6 are connected to the gate terminals of the transistors M1 and M2, respectively.

If the base current of the transistor Ti is considered negligible, the current through the diodes Di1 and Di2 is equal to the input current Ii. From the equation which defines the relation between the voltage and the current in a generic pn junction:

$$Ii = Isi \cdot \left(e^{\frac{V1}{Vt}} - 1\right) \text{ and } Ii = Isi \cdot \left(e^{\frac{V2}{Vt}} - 1\right)$$

V1 and V2 are the voltages at the terminals of the diodes Di1 and Di2, respectively. Isi is the inverse saturation current of the diodes Di1 and Di2, and Vt is the thermal voltage. If the unit relative to the exponential is ignored, the voltage V1 and the voltage V2 are equal to:

$$V1 = Vt \cdot \ln\left(\frac{Ii}{Isi}\right) \text{ and } V2 = Vt \cdot \ln\left(\frac{Ii}{Isi}\right)$$

The voltage Vi at the terminals of the series diodes Di1 and Di2 is thus:

$$Vi = Vt \cdot \ln\left(\frac{Ii}{Isi}\right) + Vt \cdot \ln\left(\frac{Ii}{Isi}\right) = 2 \cdot Vt \cdot \ln\left(\frac{Ii}{Isi}\right) = Vt \cdot \ln\left(\frac{Ii^2}{Isi^2}\right)$$

Similarly, if the base current of the transistor Tr is ignored and the inverse saturation current of the diode Dr is indicated Isr, the voltage Vr at the terminals of the diode Dr is:

$$Vr = Vt \cdot \ln\left(\frac{Ir}{Isr}\right)$$

The base-emitter voltages of the transistors Ti and Tr are indicated as Vbei and Vber, respectively. If the voltages Vbei and Vber are considered substantially equal to one another, the base-emitter voltage Vbeo of the transistor To is equal to:

$$Vbeo = Vt \cdot \ln\left(\frac{Ii^2}{Isi^2}\right) + Vbei - Vt \cdot \ln\left(\frac{Ir}{Isr}\right) - Vber = Vt \cdot \ln\left(\frac{Ii^2}{Isi^2} \cdot \frac{Isr}{Ir}\right)$$

With similar considerations applied to the transistor To, if the base and collector currents are indicated as Ib and Ic, respectively, the static current gain is indicated as hfe, and the inverse saturation current of the base-emitter junction is indicated as Iso, then:

$$Ic = hfe \cdot Ib$$
$$= hfe \cdot Iso \cdot \left(e^{\frac{Vbeo}{Vt}} - 1\right)$$
$$\cong hfe \cdot Iso \cdot e^{\frac{Vbeo}{bt}}$$
$$= hfe \cdot Iso \cdot e^{\frac{VT}{VT}\ln\left(\frac{Ii^2}{Isi^2} \cdot \frac{Isr}{Ir}\right)}$$
$$= hfe \cdot Iso \cdot \left(\frac{Ii^2 \cdot Isr}{Isi^2 \cdot Ir}\right)$$
$$= \left(hfe \cdot \frac{Isr \cdot Iso}{Isi^2 \cdot Ir}\right) \cdot Ii^2$$

The current Ic is mirrored by the structure M1, M2, M5 M6 at the output terminal 105o that:

$$Io = Ic = \left(hfe \cdot \frac{Isr \cdot Iso}{Isi^2 \cdot Ir}\right) \cdot Ii^2$$

The branch M3, M4 operates as an active load on transistor Ti. In particular, assuming that Isi=Isr=Iso and hfe=1, then:

$$Io = \frac{Ii^2}{Ir}$$

The output current Io is thus proportional to the square of the input current Ii.

Figure 1B:
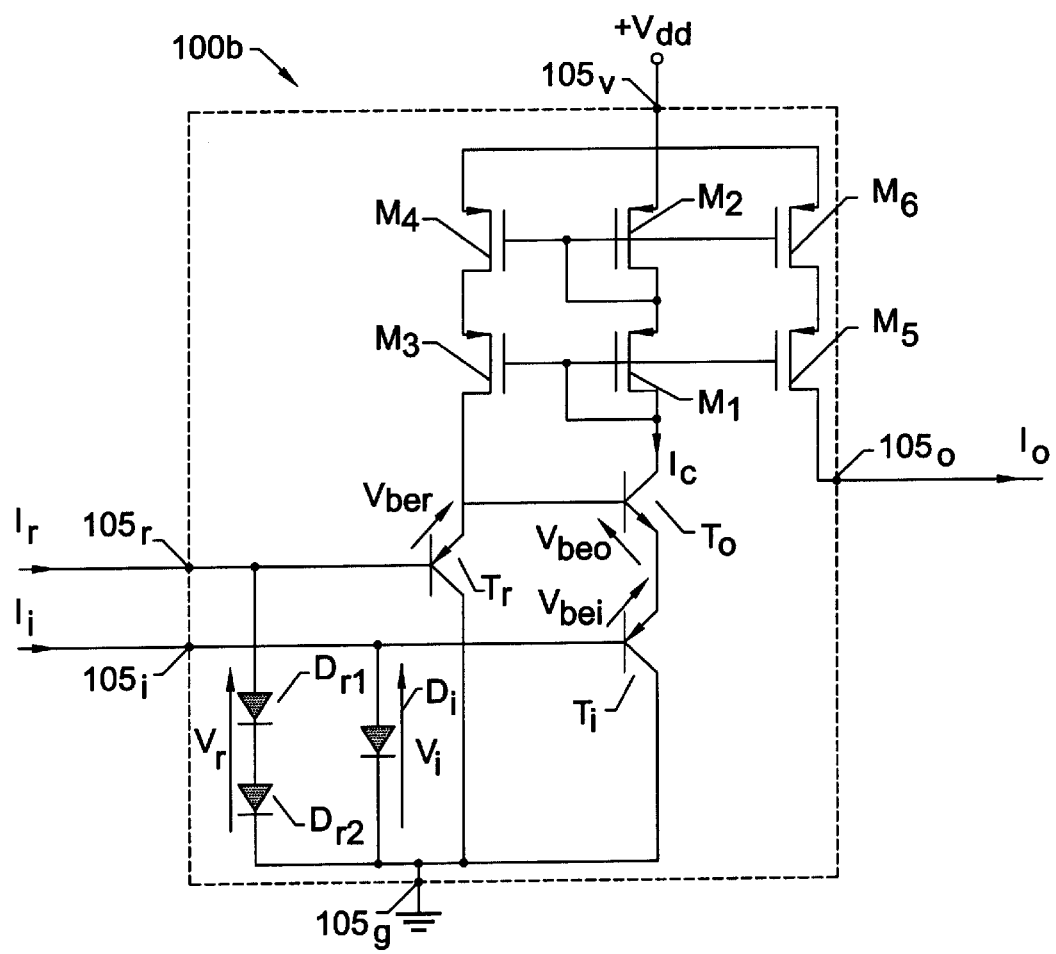
FIG. 1b is basic circuit diagram of an alternative embodiment of the electronic device according to the present invention.

Alternatively, as shown in FIG. 1b, an electronic device 100b having a hyperbolic function is provided. Elements corresponding to those shown in the previous drawing are identified by the same reference numerals or symbols and an explanation thereof is omitted. In FIG. 1b, a single diode Di is connected between the input terminal 105i and the supply terminal 105g, and two diodes Dr1 and Dr2 are connected in series between the reference terminal 105r and the supply terminal 105g. The transistor To has its base terminal connected to the emitter terminal of the transistor Tr, and its emitter terminal connected to the emitter terminal of the transistor Ti.

By similar considerations to those given above:

$$Vi = Vt \cdot \ln\left(\frac{Ii}{Isi}\right) \text{ and } Vr = Vt \cdot \ln\left(\frac{Ir^2}{Isr^2}\right)$$

from which:

$$Vbeo = Vt \cdot \ln\left(\frac{Ir^2}{Isr^2}\right) + Vber - Vt \cdot \ln\left(\frac{Ii}{Isi}\right) - Vbei$$
$$= Vt \cdot \ln\left(\frac{Ir^2}{Isr^2} \cdot \frac{Isi}{Ii}\right)$$

The output current Io is thus equal to:

$$Io = Ic = hfe \cdot Iso \cdot e^{\frac{Vt}{Vt}\ln\left(\frac{Ir^2 \cdot Isi}{Isr^2 \cdot Ii}\right)}$$
$$= hfe \cdot Iso \cdot \left(\frac{Ir^2 \cdot Isi}{Isr^2 \cdot Ii}\right)$$
$$= \left(hfe \cdot \frac{Ir^2 \cdot Isi \cdot Iso}{Isr^2}\right) \cdot Ii^{-1}$$

In particular, upon the assumption that Isi=Isr=Iso and hfe=1:

$$Io = Ir^2 \cdot Ii^{-1}$$

The output current Io is thus a hyperbolic function of the input current Ii, i.e., their product is constant.

Similar considerations apply if the electronic device is produced by a different technique, or is not formed as an integrated circuit. Equivalent circuit arrangements may be used. For example, the output transistor To is replaced by a different junction element, the diodes are formed by bipolar transistors, the transistors Ti, Tr are npn transistors, the transistor To is a pnp transistor, and the load of the transistor Ti is a resistor.

More generally, the arrangement according to the present invention provides a power rising electronic device in which the output current is a function of a power of the input current having a relative whole-number (positive or negative) exponent. The number of diodes are equal to the absolute value N of the exponent. One or more diodes are connected in series with one another to produce, from the input current, an input voltage which is a logarithmic function of an Nth power of the input current. The electronic device includes an output junction element to which a voltage is applied to produce a current that is an exponential function of the voltage applied, and from which the output current is obtained. The voltage applied to the output junction element is a function of the input voltage. The arrangement of the present invention is relatively straight forward. The electronic device is particularly compact and occupies a limited amount of surface area on the chip of semiconductor material when produced as an integrated circuit.

The electronic device according to the present invention is very accurate and stable since it is affected in very limited by temperature variations. Moreover, the output current is independent of the supply voltage so that the electronic device has very high supply-voltage noise rejection.

Figure 2:
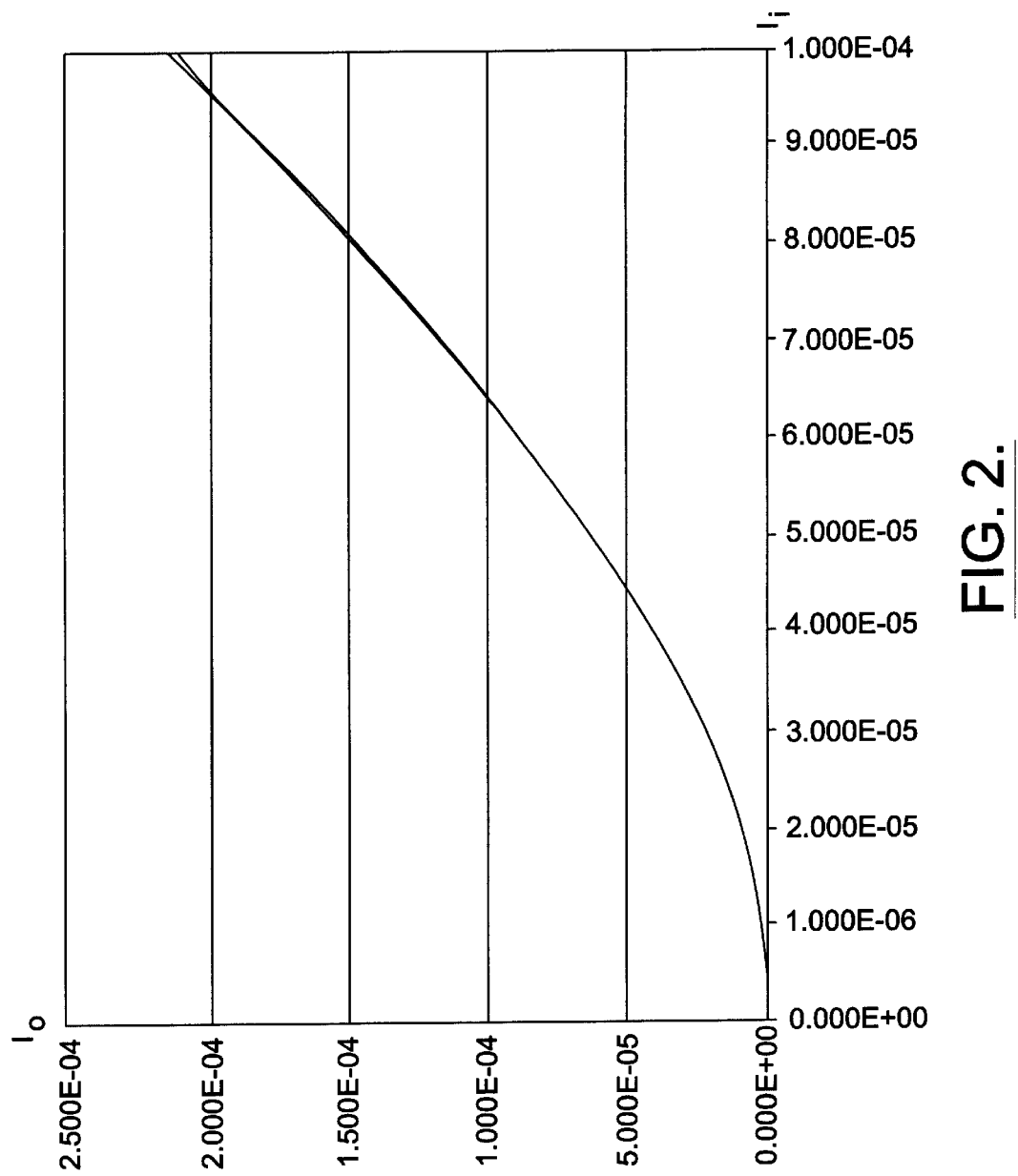
FIG. 2 is a plot of the output current of the electronic device of FIG. 1a as a function of the input current at various temperatures.

In the particular embodiment of the present invention shown in FIG. 1a, the diode Dr and the reference current Ir produce a voltage Vbeo which is directly proportional, in accordance with the thermal voltage Vt, to the logarithmic term having the square of the input current Ii as its argument. Similar considerations apply to the electronic device of FIG. 1b. The term Vt is significantly dependent on temperature, and thus disappears from the formula which defines the output current Io. FIG. 2 shows, by way of example, the curve of the output current Io as a function of the input current Ii. The reference current Ir is set at 40 $\mu$A. In particular, several curves of the output current Io at various temperatures between 20° C. and 90° C. are shown in FIG. 2. The output current Io is substantially independent of the temperature. Moreover, the output current Io is directly proportional to the square of the input current Ii without any linear component.

These elements also ensure that the voltage Vbeo has a value to permit correct biasing of the transistor To. In particular, in the embodiment shown in FIG. 1a, the number of diodes (Dr) connected to the reference terminal 105r is, in general, equal to the number of diodes (Di1, Di2) connected to the input terminal 105i minus one. The voltage Vbeo is equal to the difference between the voltage Vi and the voltage Vr. In contrast, in the embodiment shown in FIG. 1b, the number of diodes (Dr1, Dr1) connected to the reference terminal 105r is equal to the number of diodes (Di) connected to the input terminal 105i plus one. The voltage Vbeo is equal to the difference between the voltage Vr and the voltage Vi.

The transistors Ti and Tr are used to decouple the diodes Di1, Di2 and Dr, respectively, from the transistor To so that the input current Ii and the reference current Ir flow entirely through the corresponding diodes Di1, Di2 and Dr. The transistors Ti, Tr also operate as voltage translators for biasing the transistor To. The current-mirror M1–M6 decouples the transistor To from a load (not shown) connected to the output terminal 105o. The output current Io is thus substantially independent of an output voltage at the terminals of the load. Moreover, the cascode structure of the current-mirror M1–M6 ensures great accuracy of the current mirror.

Similar considerations apply if a different number of diodes are connected to the input terminal and to the reference terminal. Similar considerations also apply to the following: other equivalent means are provided for supplying a reference voltage; the transistors Ti and Tr are replaced by other decoupling elements; and the current-mirror does not have a cascode structure. The electronic device of the present invention may also be formed for applying a voltage which is a function of the voltage Vi between the base terminal and the emitter terminal of the transistor To. The electronic device may be formed for deriving the output current Io from the current Ic, or even with a connection between the collector terminal of the transistor To and the output terminal 105o.

To satisfy contingent and specific requirements, an expert in the art may apply to the above-described power rising electronic device many modifications and variations all of which, however, are included within the scope of protection of the invention as defined by the following claims.

That which is claimed is:

1. A power rising electronic device comprising:

an input terminal for receiving an input current;

an output terminal for providing an output current that is a function of a power of the input current having a whole-number exponent that has a value less than or equal to –1 or greater than or equal to 2;

at least one input diode connected between the input terminal and a supply terminal to generate an input voltage that is a logarithmic function of a power of the input current having an exponent equal to the absolute value of the whole-number exponent, a number of said at least one input diode being equal to the absolute value of the whole-number exponent;

an output junction element receiving a voltage that is a function of the input voltage to generate a current that is an exponential function of the voltage, the generated current being used to derive the output current; and a reference circuit for supplying a reference voltage so that the voltage applied to said output junction element is equal to a difference between the input voltage and the reference voltage, said reference circuit comprising a reference terminal for receiving a reference current, and at least one reference diode connected in series between the reference terminal and the supply terminal for generating the reference voltage that is a logarithmic function of a power of the reference current with an exponent equal to a number of said at least one reference diode, a number of said at least one reference diode being equal to the absolute value of the whole-number exponent minus one if the voltage applied to said output junction element is equal to the difference between the input voltage and the reference voltage, and being equal to the absolute value of the whole-number exponent plus one if the voltage applied to said output junction element is equal to the difference between the reference voltage and the input voltage.

2. An electronic device according to claim 1, wherein said output junction element comprises a bipolar transistor having a base, a collector and an emitter, the voltage applied to said output junction element is a base-emitter voltage and the generated current is a collector current.

3. An electronic device according to claim 1, wherein said output junction element comprises a bipolar transistor having a base terminal, a collector terminal and an emitter terminal, the electronic device further comprising:

a first decoupling element connected between the input terminal and the base terminal of said output junction element; and a second decoupling element connected between a reference terminal and the emitter terminal of said output junction element.

4. An electronic device according to claim 3, wherein said first decoupling element comprises a first bipolar transistor having a polarity opposite a polarity of said output junction element, said first bipolar transistor having an emitter terminal connected to the base terminal of said output terminal element, a base terminal connected to the input terminal and a collector terminal connected to a supply terminal; and wherein said second decoupling element comprises a second bipolar transistor having a polarity opposite the polarity of said output junction element, said second bipolar transistor having an emitter terminal connected to the emitter terminal of said output junction element, a base terminal connected to the reference terminal, and a collector terminal connected to a supply terminal.

5. An electronic device according to claim 1, further comprising a current-mirror connected between said output junction element and the output terminal.

6. An electronic device according to claim 5, wherein said current-mirror has a cascode structure.

7. An electronic device according to claim 5, wherein said output junction element comprises a bipolar transistor having a base terminal, a collector terminal and an emitter terminal; and wherein said current-mirror is a dual current-mirror having an input branch connected between the collector terminal and a second supply terminal, a first output branch connected between the base terminal and the second supply terminal, and a second output branch connected between the output terminal and the second supply terminal.

8. A power rising electronic device comprising:
an input terminal for receiving an input current;
an output terminal for providing an output current that is a function of a power of the input current having a whole-number exponent;
at least one input diode connected with the input terminal to generate an input voltage, a number of said at least one input diode being equal to the absolute value of the whole-number exponent that has a value less than or equal to −1 or greater than or equal to 2;
an output junction element receiving a voltage that is a function of the input voltage to generate a current that is an exponential function of the voltage, the generated current being used to derive the output current, said output junction element comprising a bipolar transistor having a base terminal, a collector terminal and an emitter terminal;
a first decoupling element connected between the input terminal and the base terminal of said output junction element, and comprising a first bipolar transistor having a polarity opposite a Polarity of said output junction element, said first bipolar transistor having an emitter terminal connected to the base terminal of said output terminal element, a base terminal connected to the input terminal and a collector terminal connected to a supply terminal;
a second decoupling element connected between a reference terminal and the emitter terminal of said output junction element, and comprising a second bipolar transistor having a polarity opposite the polarity of said output junction element, said second bipolar transistor having an emitter terminal connected to the emitter terminal of said output junction element, a base terminal connected to the reference terminal, and a collector terminal connected to a supply terminal; and a reference circuit for supplying a reference voltage so that the voltage applied to said output junction element is equal to a difference between the input voltage and the reference voltage.

9. An electronic device according to claim 8, wherein the input voltage generated by said at least one input diode is a logarithmic function of a power of the input current having an exponent equal to the absolute value of the whole-number exponent.

10. An electronic device according to claim 8, wherein said output junction element comprises a bipolar transistor having a base, a collector and an emitter, the voltage applied to said output junction element is a base-emitter voltage and the generated current is a collector current.

11. An electronic device according to claim 8, wherein said at least one input diode is connected between the input terminal and a supply terminal; and wherein said reference circuit comprises:
a reference terminal for receiving a reference current; and
at least one reference diode connected between the reference terminal and the supply terminal for generating the reference voltage that is a logarithmic function of a power of the reference current with an exponent equal to a number of said at least one reference diode.

12. An electronic device according to claim 11, wherein the number of said at least one reference diode equals the absolute value of the whole-number exponent minus one if the voltage applied to said output junction element is equal to the difference between the input voltage and the reference voltage, and equals the absolute value of the whole-number exponent plus one if the voltage applied to said output junction element is equal to the difference between the reference voltage and the input voltage.

13. An electronic device according to claim 8, further comprising a current-mirror connected between said output junction element and the output terminal.

14. An electronic device according to claim 13, wherein said current-mirror has a cascode structure.

15. An electronic device according to claim 13, wherein said current-mirror is a dual current-mirror having an input branch connected between the collector terminal of said output junction element and a second supply terminal, a first output branch connected between the base terminal of said output junction element and the second supply terminal, and a second output branch connected between the output terminal and the second supply terminal.

16. A method for generating an output current that is a function of a power of an input current having a whole-number exponent, the method comprising the steps of:
generating an input voltage using at least one input diode connected between the input terminal and a supply terminal, a number of the at least one input diode being equal to the absolute value of the whole-number exponent that has an absolute less than or equal to −1 or greater than or equal to 2, the input voltage is a logarithmic function of a power of the input current having an exponent equal to the absolute value of the whole-number exponent;
generating a voltage that is a function of the input voltage for an output junction element for generating a current that is an exponential function of the voltage, and generating the voltage comprising generating a reference voltage using at least one reference diode connected in series between a reference terminal and the supply terminal, the reference voltage is a logarithmic function of a power of the reference current with an exponent equal to a number of the at least one reference diode;

a number of the at least one reference diode equals the absolute value of the whole-number exponent minus one if the voltage applied to the output junction element is equal to the difference between the input voltage and the reference voltage, and equals the absolute value of the whole-number exponent plus one if the voltage applied to the output junction element is equal to the difference between the reference voltage and the input voltage; and deriving the output current from the generated current.

17. A method according to claim 16, wherein the output junction element comprises a bipolar transistor having a base, a collector and an emitter; the voltage applied to the output junction element is a base-emitter voltage and the generated current is a collector current.

18. A method according to claim 16, wherein the reference voltage applied to the output junction element is equal to a difference between the input voltage and the reference voltage.

19. A method according to claim 18, wherein the at least one input diode is connected between the input terminal and a supply terminal; and wherein the step of generating a reference voltage comprises generating a reference voltage using at least one reference diode connected in series between a reference terminal and the supply terminal, the reference voltage is a logarithmic function of a power of the reference current with an exponent equal to a number of the at least one reference diode.

20. A method according to claim 16, further comprising the step of decoupling the output junction element from an output terminal using a current mirror.

* * * * *

UNITED STATES PATENT AND TRADEMARK OFFICE
CERTIFICATE OF CORRECTION

PATENT NO. : 6,215,292 B1
DATED : April 10, 2001
INVENTOR(S) : Riccardo Maggi, Adam Ghozeil Page 1 of 1

It is certified that error appears in the above-identified patent and that said Letters Patent is hereby corrected as shown below:

Title page,
Insert -- BASED UPON AN INPUT CURRENT HAVING A WHOLE-NUMBER EXPONENT -- after "CURRENT"

Column 1,
Lines 1 and 2, insert -- BASED UPON AN INPUT CURRENT HAVING A WHOLE-NUMBER EXPONENT -- after "CURRENT"

Column 2,
Line 43, delete, "MS," insert -- M5, --
Line 47, delete, "MS," insert -- M5, --

Column 3,
Line 56, delete, "$\frac{Vbeo}{bt}$," insert -- $\frac{Vbeo}{vt}$ --

Column 5,
Line 42, delete, "(Di1', Di2) insert -- (Di1, Di2) --

Signed and Sealed this

Thirtieth Day of October, 2001

Attest:

NICHOLAS P. GODICI
Attesting Officer    Acting Director of the United States Patent and Trademark Office